United States Patent [19]

Kimura

[11] Patent Number: 4,818,996
[45] Date of Patent: Apr. 4, 1989

[54] DIGITAL-TO-ANALOG CONVERTING CIRCUIT

[75] Inventor: Shigenobu Kimura, Hamamatsu, Japan

[73] Assignee: Yamaha Corporation, Hamamatsu, Japan

[21] Appl. No.: 97,846

[22] Filed: Sep. 16, 1987

[30] Foreign Application Priority Data

Sep. 24, 1986 [JP] Japan .................. 61-225659

[51] Int. Cl.[4] .......................................... H03K 13/02
[52] U.S. Cl. .................................................. 341/144
[58] Field of Search ............... 340/347 DA; 341/144, 341/145, 148

[56] References Cited

U.S. PATENT DOCUMENTS 4,450,433 5/1984 Moriyama ................ 340/347 DA

Primary Examiner—Vit W. Miska
Attorney, Agent, or Firm—Spensley Horn Jubas & Lubitz

[57] ABSTRACT

A digital-to-analog converting circuit increases an absolute value of inputted digital data by a bit shift operation when minute digital data are inputted thereto. The shifted digital data are converted into an analog signal, and thereafter, such analog signal is attenuated in accordance with a shift value of the bit shift operation. The bit shift operation and the attenuation operation are performed when the value of the inputted digital data are smaller than a predetermined value for a predetermined time or more. Thus, a conversion accuracy of the minute digital data is raised, and a distortion generation depending on a frequently switching of the bit shift is avoided.

7 Claims, 2 Drawing Sheets

DIGITAL-TO-ANALOG CONVERTING CIRCUIT

BACKGROUND OF THE INVENTION

1. Field of the Invention

The present invention generally relates to digital-to-analog converting circuits, and more particularly to a digital-to-analog converting circuit for digital audio circuits and the like.

2. Prior Art

In digital audio circuits such as a playback circuit of a compact disk, it is very important to reduce a distortion level in a playback processing of a minute signal as much as possible. In a conventional digital-to-analog converting circuit (hereinafter, referred to as a D/A converting circuit), pure binary data are converted into an analog signal by use of a weighted resistor group or a R-2R resistor ladder and the like. However, such conventional D/A converting circuit suffers a problem in that the distortion level in the processing of the minute signal must be relatively large. In order to reduce such distortion level, a floating point type D/A converting circuit is proposed. In this case, floating point data are applied to the D/A converting circuit wherein the floating point data are converted into an analog signal. Such D/A converting circuit is advantageous in that it is possible to reduce the distortion level in the processing of the minute signal. However, it is disadvantageous that the input data must be divided into an exponent-part and a mantissa-part. Hence, it is difficult to apply the pure binary data into the floating point type D/A converting circuit.

Therefore, the applicant of the present invention proposed a digital-to-analog converting circuit (i.e., Japanese Patent Application Preliminary Publication No. Sho61-87431) wherein the pure binary data can be applied thereto and the distortion level in the processing of the minute signal can be reduced. This proposed D/A converting circuit is one type of the floating point type D/A converting circuit wherein a bit shift operation is performed on the input data thereof in response to the value of the input data.

In the above D/A converting circuit, the bit shift operation is performed frequently when the value of the input data is varied frequently. Hence, a switching operation must be performed frequently in a switching circuit provided within the D/A converting circuit. Due to such frequently switching operation, a distortion depending on the switching operation must be generated frequently and such distortion deteriorates a quality of a reproduced tone if a difference between circuit. constants at times before and after a switching timing occurs or the input signal includes a DC offset level, for example.

SUMMARY OF THE INVENTION

It is therefore a primary object of the invention to provide a D/A converting circuit in which the pure binary data can be applied thereto and the distortion level in the processing of the minute signal is relatively low.

It is another object of the invention to provide a D/A converting circuit in which it is possible to reduce a frequency for generating distortions depending on the switching operations of the bit shift.

In a first aspect of the invention, there is provided a D/A converting circuit comprising: (a) detecting means for detecting whether upper K (where K denotes as a positive integral number) bits of inputted digital data are identified as unnecessary bits for a predetermined time or more or not, the detecting means outputting a detection signal when the upper K bits are identified as the unnecessary bits for the predetermined time or more; (b) bit shift means for shifting the digital data by M (where M denotes as a positive integral number, and M is set as $M<K$) bits in an upper bit direction so as to generate and output shifted data when the detection signal is supplied thereto, the bit shift means passing through the digital data when the detection signal is not supplied thereto; (c) converting means for converting the output data of the bit shift means into an analog signal; and (d) attenuating means for attenuating the analog signal outputted from the converting means in accordance with the number M of the shifting bits when the detection signal is outputted from the detecting means.

In a second aspect of the invention, there is provided a D/A converting circuit comprising: (a) over sampling means for converting inputted digital data of I (where I denotes as a positive integral number) bits into data of J (where J denotes as a positive integral number and J is set as $J>I$); (b) detecting means for detecting whether an absolute value of the digital data is smaller than a predetermined value for a predetermined time or more or not, the detecting means outputting a shift signal when the absolute value is smaller than the predetermined value for the predetermined time or more; (c) bit shift means for shifting the data of J bits outputted from the over sampling means by M (where M is set equal to a positive integral number of J-I) bits in an upper bit direction so as to generate shifted data of I bits when the shift signal is supplied thereto, the bit shift means extracting the digital data of I bits from the data of J bits when the shift signal is not supplied thereto; (d) converting means for converting the data of I bits outputted from the bit shift means into an analog signal; and (e) attenuating means for attenuating the analog signal outputted from the converting means by $2^{-M}$ when the shift signal is outputted from the detecting means, and the attenuating means passing through the analog signal outputted from the converting means when the shift signal is not outputted from the detecting means.

BRIEF DESCRIPTION OF THE DRAWINGS

Further objects and advantages of the present invention will be apparent from the following description, reference being had to the accompanying drawings wherein a preferred embodiment of the present invention is clearly shown.

In the drawings.

DESCRIPTION OF THE PREFERRED EMBODIMENT

Figure 1:
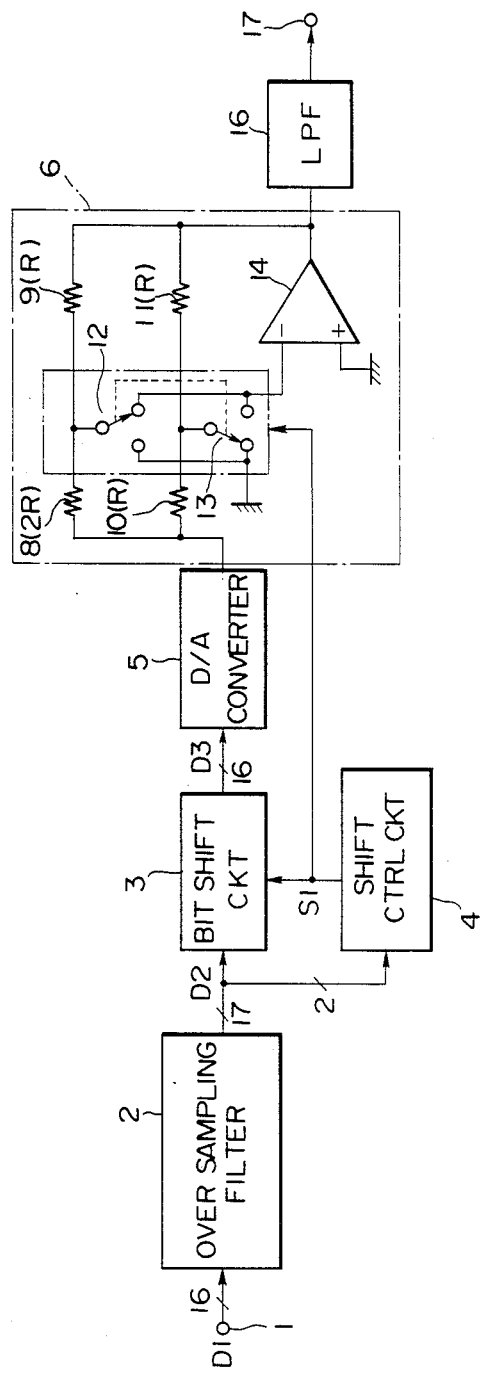
FIG. 1 is a block diagram showing an embodiment of the present invention.

Referring now to the drawings, FIG. 1 is a block diagram showing an embodiment of a D/A converting circuit according to the present invention. This embodiment relates to a digital audio circuit wherein digital data are reproduced from the compact disk and the like and such reproduced digital data are converted into an analog signal.

In FIG. 1, 1 designates an input terminal which is applied with digital data D1 to be converted into the analog signal. This digital data D1 is in the form of data of sixteen bits constituted by a binary code (having a negative value and formed by two's complement). Therefore, the value of the most significant bit (MSB) becomes equal to "0" when the digital data D1 designate a positive value, and the value of MSB becomes equal to "1" when the digital data D1 designate a negative value. In FIG. 1, 2 designates an over sampling filter inputted by the digital data D1. This over sampling filter 2 is constituted by a FIR digital filter which is often used for a compact disk player in these days. In other words, the filter 2 is identified as a so-called interpolation filter wherein interpolation data are generated between sequentially inputted two data and the interpolation data are added to the input data so as to generate data D2. For example, when the sampling frequency of the (twice) over sampling filter 2 is set twice as a sampling frequency of the data D1, one interpolation data are added between sequentially inputted two data within the data D1. In addition, when the sampling frequency of the (triple) over sampling filter 2 is set four times as the sampling frequency of the data D1, three interpolation data are added between sequentially inputted two data within the data D1.

In the meantime, the sampling frequency of the compact disk is set to 44.1 kHz. However, it is possible to output the data having a sampling frequency of 88.2 kHz from the above twice over sampling filter 2. In addition, it is possible to output the data having a sampling frequency of 176.4 kHz from the above four times over sampling filter 2. Furthermore, the over sampling filter 2 outputs data D2 of seventeen bits.

When a shift control circuit 4 outputs a signal S1 having a "1" level to a bit shift circuit 3, the bit shift circuit 3 shifts the data D2 of seventeen bits by one bit so as to generate data D3 of sixteen bits. More specifically, when every bit values of the data D2 are expressed as "$A_0, A_1, \ldots, A_{15}, A_{16}$", every bit values of the data D3 (i.e., the lower sixteen bits of the data D2) can be exprsssed as "$A_1, A_2, \ldots, A_{15}, A_{16}$". On the contrary, when the level of the signal S1 is set to a "0" level, every bit values of the data D3 (i.e., the upper sixteen bits of the data D2) can be expressed as "$A_0, A_1, \ldots, A_{14}, A_{15}$". A D/A converter 5 is constituted by the conventional D/A converter using the known R-2R resistor ladder wherein the data D3 are converted into an analog signal. An attenuator 6 is constituted by a resistor 8 (having a resistance of 2R), resistors 9 to 11 (each having a resistance of R), switches 12 and 13 (which are interlocked by each other) and an operational amplifier 14. The output signal level of the D/A converter 5 is attenuated in the attenuator 6. The switches 12 and 13 are switched under the control of the shift signal S1. FIG. 1 shows the connection condition where the shift signal S1 is set identical to a "1" signal. On the contrary, such connected contacts of the switches 12 and 13 are inverted when the shift signal S1 is set identical to a "0" signal. As a result, the attenuator 6 works as an inverting attenuator having an attenuation rate of ½ when the shift signal S1 is set identical to the "1" signal. On the contrary, the attenuator 6 works as an inverting attenuator having an attenuation rate of 1/1 when the shift signal S1 is set identical to the "0" signal. The output signal of the attenuator 6 is supplied to an analog low-pass filter 16 which filters out the signal having an audio frequency band of lower than 20 kHz from the output signal of the attenuator 6.

In the above-mentioned embodiment, the apparent sampling frequency is raised up by use of the over sampling filter 2. As is obvious to those skilled in art, a cut-off characteristics of the low-pass filter 16 may have a gentle curve. Thus, the output signal of the low-pass filter 16 is outputted via the output terminal 17.

Figure 2:
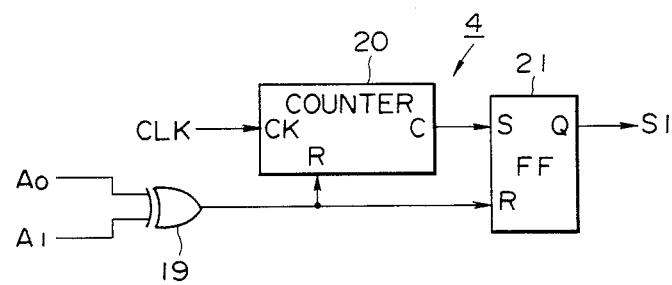
FIG. 2 is a block diagram showing specific circuit of the shift control circuit in the circuit shown in FIG. 1.

Next, detailed description will be given with respect to the shift control circuit 4 in conjunction with FIG. 2. As shown in FIG. 2, the shift control circuit 4 is constituted by an exclusive OR gate 19, a counter 20 and a reset-set flip-flop 21 (i.e., a RS flip-flop 21). The exclusive OR gate 19 is constituted such that an exclusive OR operation is performed on the upper two bit values (i.e., $A_0$ and $A_1$) of the data D2. Hence, the output signal of the gate 19 turns to the "0" signal when the bit value $A_0$ coincides with the bit value $A_1$, and the output signal of the gate 19 turns to the "1" signal when the bit value $A_0$ does not coincide with the bit value $A_1$. In other words, the output signal of the gate 19 turns to the "0" signal when the bit $A_1$ is identified as an unnecessary bit (i.e., when the absolute value of the data D2 is smaller than a predetermined value and the bit $A_1$ is not needed). In addition, the output signal of the gate 19 turns to the "1" signal when the absolute value of the data D2 is larger than the predetermined value and the bit $A_1$ is identified as an effective bit. Hereinafter, the predetermined value will be referred to as a constant value G.

Figure 3:
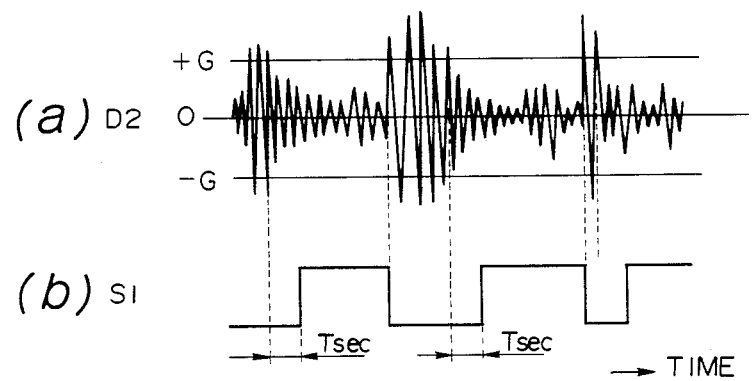
FIG. 3 show waveforms for explaining a bit shift operation of the circuit shown in FIG. 1.

The counter 20 is subject to a reset state when the gate 19 outputs the "1" signal. This counter 20 counts up a count value thereof in accordance with a system clock CLK while the gate 19 outputs the "0" signal. The carry output signal of the counter 20 is supplied to the set terminal S of the flip-flop 21. This counter 20 is used for measuring a time. More specifically, the counter 20 outputs the carry output signal thereof when the absolute value of the data D2 is continuously set lower than the constant value G during a predetermined constant time T. Then, the flip-flop 21 is set by the carry output signal of the counter 20. On the other hand, the flip-flop 21 is reset when the output signal of the gate 19 turns to the "1" signal. Thus, the signal obtained at the set output terminal Q of the flip-flop 21 is outputted as the shift signal S1. More specifically, the shift signal S1 is continuously set identical to the "1" signal when the absolute value of the data D2 is continuously maintained to the value lower than the constant value G for the constant time T. Thereafter, the shift signal S1 is maintained at the "1" signal while the absolute value of the data D2 is lower than the constant value G. As shown in FIG. 3, the shift signal S1 returns to the "0" signal when the absolute value of the data D2 becomes larger than the constant value G.

According to the embodiment shown in FIGS. 1 and 2, the shift signal S1 turns to the "1" signal when the absolute value of the data D2 is continuously maintained to the value lower than the constant value G for the constant time T or more. In this case, the bits $A_1$ to $A_{16}$ of the data D2 are shifted up by one bit in the bit shift circuit 3, so that the absolute value of the data D2 is doubled. Such doubled data D3 are converted into the analog signal in the D/A converter 5, and the level of this analog signal is attenuated by an attenuation rate of ½ in the attenuator 6, the output signal of which is supplied to the output terminal 17 via the low-pass filter 16.

On the other hand, when the absolute value of the data D2 is larger than the constant value G, the shift signal S1 is identical to the "0" signal and the bit shift operation is not performed in the bit shift circuit 3, so that the upper sixteen bits of the data D2 are outputted to the D/A converter 5 wherein such data of sixteen bits are converted into the analog signal. The level of this analog signal is attenuated by the attenuation rate of 1 (in other words, this analog signal is amplified by a gain of 1) in the attenuator 6. The output signal of the attenuator 6 is supplied to the output terminal 17 via the low-pass filter 16.

As described heretofore, a D/A conversion process of the present embodiment becomes identical to the conventional D/A conversion process in the case where the absolute value of the data D2 is larger than the constant value G. Incidentally, the problem of the conventional D/A converting circuit is that a conversion accuracy must be lowered and the distortion must be increased when the value of the data to be converted is relatively small. In the present embodiment, as described heretofore, there is no problem occurred when the conventional D/A conversion process is applied for the data D2 having the relatively large value.

Meanwhile, in the case where the absolute value of the data D2 is maintained lower than the constant value G for the constant time T or more, the absolute value of the data D2 is doubled by the bit shift operation and the data D3 are converted into the analog signal. As described before, the conversion accuracy of the D/A converting circuit is lowered when value of the data to be converted is relatively small. Therefore, the present embodiment can raise the conversion accuracy of data D2 having the relatively small value because the present embodiment performs the D/A conversion process on the data D2 the value of which is doubled. In addition, the present embodiment converts the data D1 of sixteen bits into the data D2 of seventeen bits before the one bit shift operation. Compared to the case where the least significant bit (LSB) of the data D2 is cut off by the one bit shift operation, the present embodiment can raise the accuracy of data processing (i.e., the one bit shift operation).

Next, in the case where the absolute value of the data D2 frequently increases or decreases in the present embodiment, the shift signal S1 does not become identical to the "1" signal, hence, the bit shift operation is not performed. As described heretofore, the bit shift operation is performed only in the case where such bit shift operation can be completed effectively. Thus, the present embodiment can solve any problems due to the frequently performed bit shift operation.

This invention may be practiced or embodied in still other ways without departing from the spirit or essential character thereof. For instance, the present embodiment is constituted such that the data D1 (of sixteen bits) supplied to the input terminal 1 are shifted into the data D2 of seventeen bits through the over sampling filter 2 and such data of seventeen are supplied to the bit shift circuit 3. However, it is possible to modify the present embodiment such that the data D1 is directly supplied to the bit shift circuit 3 wherein the data D1 are shifted by one bit and a bit having a value "0" is added as the LSB of such shifted data. Additionally, the present embodiment is constituted such that only one bit is shifted in the bit shift circuit 3. However, it is possible to vary the number of the shifting bits in the bit shift circuit 3, and it is also possible to increase the bit number of the output data of the over sampling filter 2. Therefore, the preferred embodiment described herein is illustrative and not restrictive, the scope of the invention being indicated by the appended claims and all variations which come within the meaning of the claims are intended to be embraced therein.

What is claimed is:

1. A digital-to-analog converting circuit for converting digital data into an analog signal, comprising:
   (a) detecting means for detecting whether upper K (where K denotes a positive integral number) bits of inputted digital data are identified as unnecessary bits, said detecting means outputting a shift signal when said upper K bits are identified as said unnecessary bits in all of a plurality of said digital data received during a predetermined time period;
   (b) bit shift means for shifting said digital data by M (where M denotes a positive integral number, and M is set as $M \leq K$) bits in an upper bit direction so as to generate and output shifted data when said shift signal is supplied thereto, said bit shift means passing through said digital data when said shift signal is not supplied thereto;
   (c) converting means for converting the output data of said bit shift means into an analog signal; and
   (d) attenuating means for attenuating said analog signal outputted from said converting means in accordance with the number M of the shifting bits when said shift signal is outputted from said detecting means.

2. A digital-to-analog converting circuit according to claim 1, wherein an absolute value of said digital data is smaller than a predetermined value when said upper K bits are identified as said unnecessary bits in said detecting means.

3. A digital-to-analog converting circuit for converting digital data into an analog signal, comprising:
   (a) over sampling means for converting inputted digital data of I (where I denotes a positive integral number) bits into data of J (where J denotes a positive integral number and J is set as $J > I$);
   (b) detecting means for detecting whether an absolute value of said digital data is smaller than a predetermined value, said detecting means outputting a shift signal when said absolute value of all of a plurality of said digital data received by said detecting means during a predetermined time period is smaller than said predetermined value;
   (c) bit shift means for shifting said data of J bits outputted from said over sampling means by M (where M is set equal to a positive integral number of J-I) bits in an upper bit direction so as to generate shifted data of I bits when said shift signal is supplied thereto, said bit shift means extracting said digital data of I bits from said data of J bits when said shift signal is not supplied thereto;
   (d) converting means for converting the data of I bits outputted form said bit shift means into an analog signal; and
   (e) attenuating means for attenuating said analog said outputted from said converting means by $2^{-M}$ when said shift signal is outputted from said detecting means, and said attenuating means passing through said analog signal outputted from said converting means when said shift signal is not outputted from said detecting means.

4. A digital-to-analog converting circuit according to claim 3, wherein said over sampling means is constituted by a FIR digital filter which increases a sampling frequency of said digital data and interpolates said digital data, whereby said digital data of I bits are converted into said data of J bits.

5. A digital-to-analog converting circuit according to claim 3 further comprising low-pass filter means for filtering out an analog signal having a predetermined frequency band width from said analog signal outputted from said attenuating means.

6. A digital-to-analog converting circuit according to claim 3, wherein said detecting means comprises
   (a) means for outputting a detection signal when said absolute value of said digital data is smaller than said predetermined value and
   (b) shift signal generating means for generating said shift signal when said detection signal is continuously outputted from said means for said predetermined time or more.

7. A digital-to-analog converting circuit for converting digital data into an analog signal comprising:
   (a) over sampling means for converting inputted digital data of I (where I denotes a positive integral number) bits into data of J (where J denotes a positive integral number and J is set as J>I);
   (b) detecting means for detecting whether an absolute value of said digital data is smaller than a predetermined value for a predetermined time or more or not, said detecting means outputting a shift signal when said absolute value is smaller than said predetermined value for said predetermined time or more, said detecting means comprising means for outputting a detection signal when said absolute value of said digital data is smaller than said predetermined value, and
   shift signal generating means for generating said shift signal when said detection signal is continuously outputted from said means for said predetermined time or more, said shift signal generating means comprising
   counter means for counting a count value while said detection signal is continuously outputted from said means and outputting a count signal when said count value reaches to a predetermined count value corresponding to said predetermined time, and
   flip-flop means which is reset by said detection signal and which outputs said shift signal when said count signal is supplied thereto;
   (c) bit shift means for shifting said data of J bits outputted from said over sampling means by M (where M is set equal to a positive integral number of J-I) bits in an upper bit direction so as to generate shifted data of I bits when said shift signal is supplied thereto, said bit shift means extracting said digital data of I bits from said data of J bits when said shift signal is not supplied thereto;
   (d) converting means for converting the data of I bits outputted from said bit shift means into an analog signal; and
   (e) attenuating means for attenuating said analog said outputted from said converting means by $2^{-M}$ when said shift signal is outputted from said detecting means, and said attenuating means passing through said analog signal outputted from said converting means when said shift signal is not outputted from said detecting means.

* * * * *